United States Patent [19]
Nakata et al.

[11] Patent Number: 5,620,925
[45] Date of Patent: Apr. 15, 1997

[54] METHOD OF MANUFACTURING SEMICONDUCTOR DEVICE USING A HAGOLEN PLASMA TREATMENT STEP

[75] Inventors: Rempei Nakata, Tokyo; Hitoshi Itoh, Kunitachi; Takashi Endo, Tokyo; Tohru Watanabe, Yokohama, all of Japan

[73] Assignee: Kabushiki Kaisha Toshiba, Kawasaki, Japan

[21] Appl. No.: 327,450

[22] Filed: Oct. 21, 1994

Related U.S. Application Data

[63] Continuation of Ser. No. 57,415, May 6, 1993, abandoned, which is a continuation of Ser. No. 819,674, Jan. 13, 1992, abandoned, which is a continuation of Ser. No. 439,608, Nov. 21, 1989, abandoned.

[30] Foreign Application Priority Data

| Nov. 21, 1988 | [JP] | Japan | 63-292329 |
| Jan. 12, 1989 | [JP] | Japan | 1-5421 |
| Jun. 1, 1989 | [JP] | Japan | 1-139720 |

[51] Int. Cl.$^6$ ............................................. H01L 21/255
[52] U.S. Cl. ........................................ 438/641; 438/677
[58] Field of Search ........................................ 437/187, 189, 437/192, 195, 203, 228 ST

[56] References Cited

U.S. PATENT DOCUMENTS

| 4,532,702 | 8/1985 | Gigante et al. | 437/187 |
| 4,595,601 | 6/1986 | Horioka et al. | 427/53.1 |
| 4,595,608 | 6/1986 | King et al. | 427/237 |
| 4,617,087 | 10/1986 | Iyer et al. | 437/187 |
| 4,670,967 | 6/1987 | Hazuki | 437/189 |
| 4,777,061 | 10/1988 | Wu et al. | 427/39 |
| 4,902,645 | 2/1990 | Ohba | 437/200 |
| 4,904,621 | 2/1990 | Loewenstein et al. | 437/225 |
| 5,043,299 | 8/1991 | Chang et al. | 437/192 |

FOREIGN PATENT DOCUMENTS

| 0157052 | 10/1985 | European Pat. Off. . |
| 61-248525 | 11/1986 | Japan . |

OTHER PUBLICATIONS

Journal of the Electrochemical Society, vol. 134, No. 1, Jan. 1987, pp. 165–175, R. Pinto et at, "Reactive ion etching in SF6 gas mixtures".

J. Dieleman, F.H.M. Sanders, Solid State Technology, p. 191, Apr. 1984; "Plasma Effluent Etching: Selective and Non–Damaging".

Wolf, S., Silicon Processing for the VLSI Era, vol. 1, pp. 388–389, 392–394, Lattice Press, 1986.

Moriya, T., A Planar Metallization Process—Its Appl. to Tri–Level Aluminum Interconnection, IEDM 83, pp. 550–553, 1983, IEEE.

(List continued on next page.)

*Primary Examiner*—T. N. Quach
*Attorney, Agent, or Firm*—Oblon, Spivak, McClelland, Maier & Neustadt, P.C.

[57] ABSTRACT

A method of manufacturing a semiconductor device comprising the steps of forming an insulating layer on a first conductive layer deposited on a semiconductor substrate, treating the surface of the insulating layer and the exposed surface of the first conductive layer with a gas plasma containing halogen atoms, and depositing selectively a conductive material by vapor growth on the exposed surface of the first conductive layer so as to form a second conductive layer. The gas plasma containing halogen atoms can be formed by introducing a gas containing halogen atoms into the treatment chamber housing the sample, and applying high frequency power. The gas plasma containing halogen atoms can be formed by introducing a gas containing halogen atoms into the treatment chamber to adsorb the halogen atoms on the inner wall of the chamber, and applying high frequency power. Alternatively, the gas plasma can be formed by applying high frequency power after placing the sample and a halogen containing material inside the chamber. By treatment with the gas plasma containing halogen atoms, a second conductive layer can be deposited with good selectivity.

18 Claims, 8 Drawing Sheets

OTHER PUBLICATIONS

Coburn, J., Plasma–Assisted Etching, Plasma Chemistry and Plasma Processing, vol. 2, No. 1, 1982, pp. 1–6.

Vossen, J., Preparation of Surfaces for High Quality Interface Formation, J. Vac. Sci. Tech. A2 (2), Jun. 1984, pp. 212–215.

Wolf, et al., Silicon Processing, vol. 1, 1986, Lattice Press, pp. 335–365, 539–582.

METHOD OF MANUFACTURING SEMICONDUCTOR DEVICE USING A HAGOLEN PLASMA TREATMENT STEP

This application is a continuation of U.S. patent application Ser. No. 08/057,415, filed on May 6, 1993, now abandoned, a continuation of U.S. patent application Ser. No. 07/819,674, filed on Jan. 13, 1992, now abandoned, a continuation of U.S. patent application Ser. No. 07/439,608, filed on Nov. 21, 1989, now abandoned.

BACKGROUND OF THE INVENTION

1. Field of the Invention

This invention concerns a method of manufacturing a semiconductor device, and in particular concerns the improvement of selective vapor growth.

2. Description of the Related Art

In recent years, large-scaled integrated circuits (LSI) have come to be widely used in major parts of computers and communications equipment. These LSI consist of a large number of active elements and passive elements assembled in an integrated fashion on a rectangular substrate of side several mm in length such that they form the components of an electric circuit. Further, the trend is towards increasingly high levels of integration, and intensive research is being carried out to make the elements of such devices even smaller and increase the density of components in an attempt to manufacture super LSI.

In the case of LSI interconnections, for example, design specifications call for smaller size and so the wiring or the interconnection layer is of smaller width; at the same time, the number of active elements is increasing, so the wiring pattern must be finer, longer and more complex. If however aluminum, which is a wiring material, is led directly through contact holes as in ordinary wiring, several problems arise.

Firstly, more defects occur in the openings of such wiring, and electromigration effects due to electric stress are more evident.

Secondly, diffusion regions such as, for example, the source and drain of MOSLSI are tending to become shallower, but if aluminum is brought into contact with such a shallow diffusion region and subjected to heat treatment, mutual diffusion of aluminum and silicon often occurs, and the Al atoms pass through the diffusion region in what is known as a "pit" phenomenon.

Thirdly, the aspect ratio (contact hole depth/contact hole width) of contact holes used to connect the wiring to the diffusion region is increasing, and this leads to more breaks in the wiring in the holes and increased wiring resistance.

Moreover, the second and third problems above are not limited to contacts between the diffusion region and the wiring, but also occur between wiring layers in multi-layer interconnections.

A reliable wiring was therefore required which was not so much affected by these problems.

To solve these problems, methods have been proposed whereby a high melting metal layer such as tungsten (W) is deposited by a selective CVD process on Al wiring, or a high melting metal such as tungsten (W) or aluminum is filled by a selective CVD process in contact holes or via holes. In these selective CVD processes, it is possible to grow a metal layer only within a specified region by suitably choosing the conditions. In the selective CVD of a W film, for example, a gas mixture of a halide such as tungsten hexafluoride ($WF_6$) and a silane is used as a reactive gas to deposit a W film selectively on the surface of Si, Al or a high melting metal, the W film not being deposited on the surface of an insulating film such as silicon dioxide.

Figure 1:
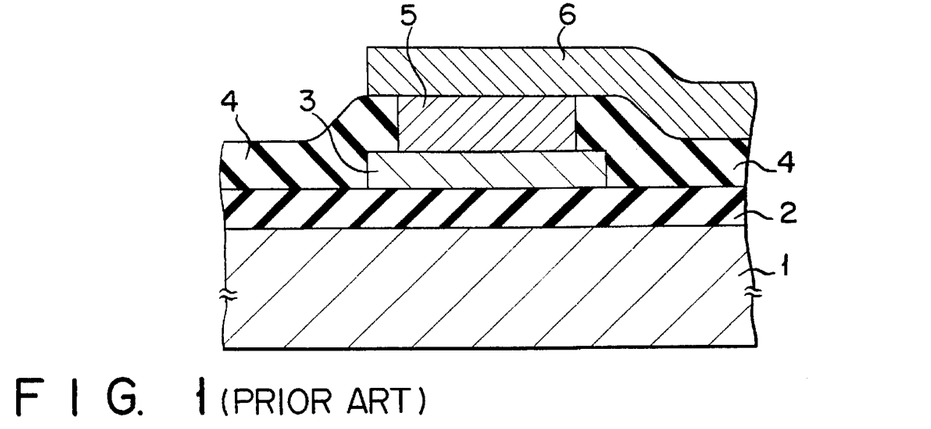
FIG. 1 is a sectional view showing a situation where a high melting metal such as tungsten (W) has been filled in a via hole.

FIG. 1 shows the situation where a high melting metal such as tungsten (W) has been filled in a via hole. In FIG. 1, a first interconnection layer 3 of aluminum is formed on an insulating film 2 deposited on a semiconductor substrate 1. This first interconnection layer 3 extends perpendicularly to the plane of the paper. Reference numeral 4 indicates an inter-layer insulating layer, and W layer 5 is deposited by selective CVD in a via hole formed in layer 4. Reference numeral 6 indicates a second interconnection layer connected to W layer 5. In this structure, there is no step on the upper edge of the via hole, and disconnection of the second interconnection layer in this part is thereby completely prevented.

Figure 2:
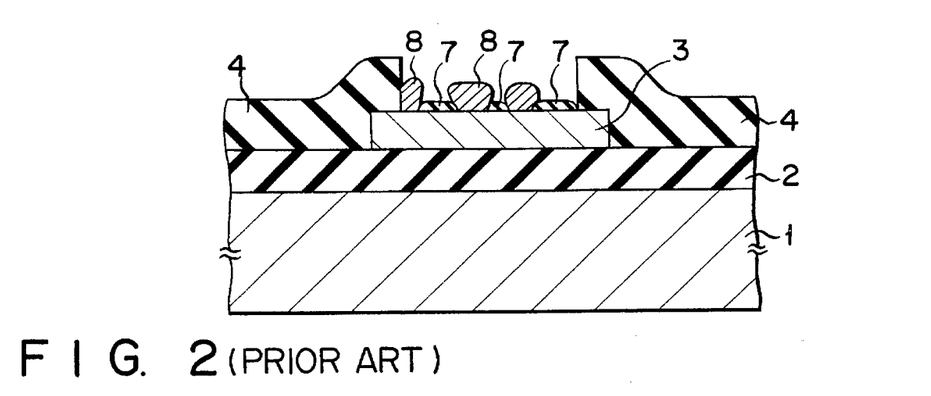
FIG. 2 is a sectional view showing a situation where an insulating material consisting of natural oxide, of good insulators such as fluoride, carbide or oxide or of mixtures of these substances, has adhered to the exposed surface of the first interconnection layer.

There are however several problems inherent in this wiring arrangement. As shown in FIG. 2, for example, if a via hole is formed in inter-layer insulating layer 4 so as to expose first interconnection layer 3, an insulating material 7, consisting of natural oxide, or good insulators such as fluoride, carbide, oxide or mixtures of these substances which may be formed for some reason when the via hole is formed, adheres to the exposed surface. It is highly possible that these insulating materials are generated from a resist material or etching gas at the time of patterning. If therefore W is deposited by selective CVD on first interconnection layer 3, it is deposited unevenly wherever such insulating material 7 is thin as shown by deposited material 8, and a perfect layer is not obtained. This is also known to be the reason why the contact resistance between first interconnection layer 3 and second interconnection layer has a fairly high value. Moreover, this insulating material 7 has a low vapor pressure and is extremely stable chemically, so it is very difficult to remove chemically.

To remove insulating material 7, a pre-treatment with dilute fluoric acid is generally carried out, but in the case of the minute via holes and contact holes found in modern high-density integrated circuits, this method does not give a sufficiently low contact resistance. Further, even if this pre-treatment is carried out with dilute fluoric acid, the substrate is exposed to the air until it is inserted in the film deposition apparatus, and a natural oxide film again forms on the exposed surface of first interconnection layer 3.

Figure 3:
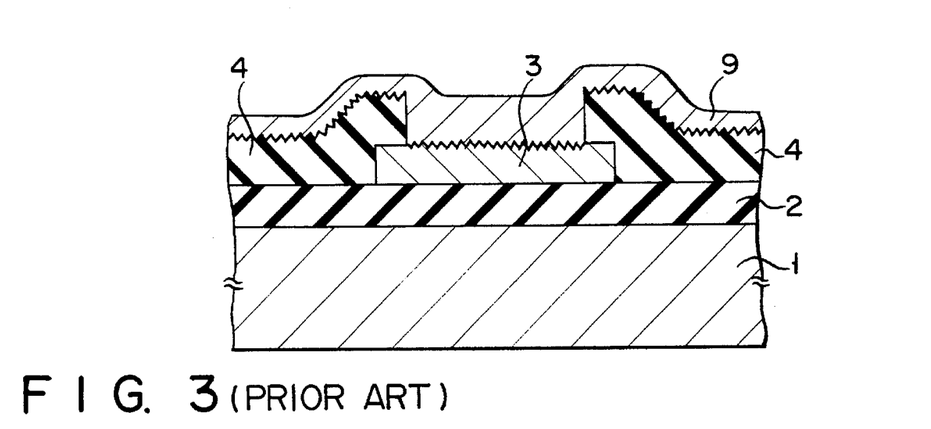
FIG. 3 is a sectional view showing a situation where W grows to form a W layer not only on the exposed surface of the first interconnection layer, but also on the surface of the inter-layer insulating layer.

A physical type of treatment by sputtering with a plasma of an inert gas such as argon, might also be envisaged. With this form of treatment, however, the surface of inter-layer insulating layer 4 is activated, and the selectivity of W in the selective CVD process is impaired. More specifically, as shown in FIG. 3, W is deposited not only on the surface of first interconnection layer 3 but also on the surface of inter-layer insulating layer 4, and a W layer 9 is formed. That is, it is difficult to deposit selectively tungsten only in the via hole. The activation of the surface of insulating layer 4 is thought to be due to the fact that sputtering causes a large number of silicon dangling bonds to project from this surface.

This problem is not limited to selective CVD of a W layer, and occurs also in the case of selective CVD of a polycrystalline layer using $SiH_4$ as the raw gas, and the selective CVD of an aluminum layer using trimethyl aluminum ($Al(CH_3)_3$) as the raw gas.

SUMMARY OF THE INVENTION

It is an object of this invention is to provide a method of manufacturing a semiconductor device wherein a uniform interconnection layer of low contact resistance can be formed.

According to one embodiment of this invention, there is provided a method of manufacturing a semiconductor device, comprising the steps of depositing selectively an insulating layer on a first conductive layer formed on a semiconductor substrate, treating the surface of the insulating layer and the exposed surface of the first conductive layer with a gas plasma containing halogen atoms, and depositing selectively a conductive material by vapor growth on the exposed surface of the first conductive layer so as to form a second conductive layer.

According to another embodiment of this invention, there is provided a method of manufacturing a semiconductor device, comprising the steps of depositing selectively an insulating layer on a first conductive layer formed on a semiconductor substrate, treating the surface of the insulating layer and the exposed surface of the first conductive layer with a gas plasma containing halogen atoms, and depositing selectively a conductive material by vapor growth on the exposed surface of the first conductive layer so as to form a second conductive layer, said gas plasma containing halogen atoms being generated by installing a halogen source in the treatment chamber and causing a discharge in the chamber.

According to a further embodiment of this invention, there is provide a method of manufacturing a semiconductor device, comprising the steps of depositing selectively an insulating layer on a first conductive layer formed on a semiconductor substrate, treating the surface of the insulating layer and the exposed surface of the first conductive layer with a gas plasma containing halogen atoms, treating the treated surface with a gas plasma containing hydrogen atoms, and depositing selectively a conductive material by vapor growth on the exposed surface of the first conductive layer so as to form a second conductive layer.

DETAILED DESCRIPTION OF THE PREFERRED EMBODIMENTS

In the method of this invention, when a second conductive layer is selectively deposited by vapor growth on the exposed surface of the first conductive layer which is partially covered by an insulating layer, the entire surface, that is the surface of the insulating layer and the exposed surface of the first conductive layer, is pretreated by a gas plasma containing halogen atoms prior to vapor growth.

Figure 4:
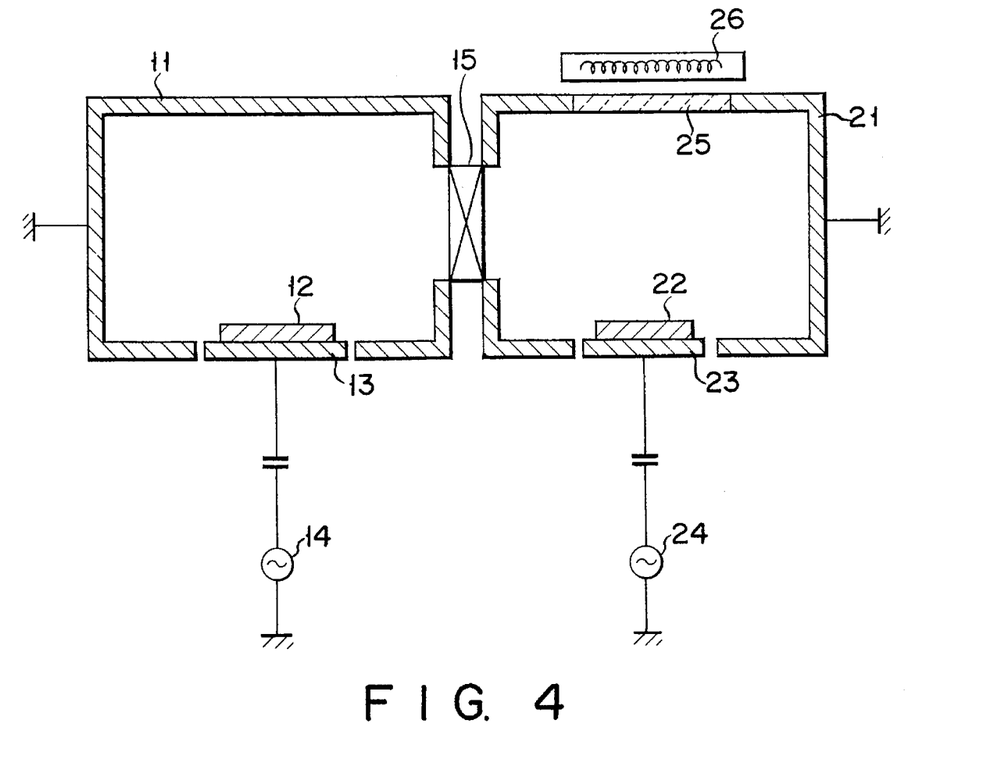
FIG. 4 is a sectional view showing a film deposition apparatus for carrying out the method of one embodiment of this invention.

FIG. 4 is a sectional view showing a typical film deposition apparatus for carrying out the method of this invention.

The film deposition apparatus in FIG. 4 consists of a pretreatment chamber 11, a reaction chamber 21, and a gate valve 15 connecting these chambers 11 and 21 such that the substrate 12 can be transported between them. Gate valve 15 may have any desired structure provided that it functions such that chambers 11 and 21 can be isolated from one another when the substrate is treated in either one of them, and such that air does not come into contact with the substrate when the substrate is transported from pretreatment chamber 11 to reaction chamber 21.

First electrode 13 in pretreatment chamber 11 serves also as a susceptor upon which substrate 12 is mounted, and high frequency power is applied to first electrode 13 from an external high frequency source 14. Second electrode 23 in reaction chamber 21 serves also as a susceptor upon which substrate 22 is mounted, and high frequency power is applied to second electrode 23 from an external high frequency source 24.

A quartz window 25 is provided in reaction chamber 21, and an infrared ray lamp 26 is installed outside reaction chamber 21 facing this window so as to heat substrate 22.

The metal containers which constitute pretreatment chamber 11 and reaction chamber 21 are both grounded. Further, although not shown in FIG. 4, a gas inlet pipe and gas outlet pipe are provided in both pretreatment chamber 11 and reaction chamber 21 to introduce specified gases.

When the method of this invention is carried out using the apparatus described above, substrate 12, provided with a first conductive layer partially covered with an insulating layer, is initially mounted on first electrode 13 in pretreatment chamber 11. At this time, gate valve 15 is closed.

The material constituting the first conductive layer may be aluminum, molybdenum, copper, tungsten, titanium, molybdenum silicide, tungsten silicide, titanium silicide or titanium nitride. It may also be a conductive Group IV semiconductor doped with high concentration of impurity, such as silicon or germanium, or a Group III-V compound semiconductor such as GaAs or InP.

The material constituting the insulating layer may be silicon dioxide or silicon nitride, or either of these materials doped with impurities such as P or B.

The material constituting the substrate is not limited to semiconductors such as silicon, germanium, GaAs and InP, but may also be an insulator such as glass or sapphire.

After introducing a gas containing halogen atoms into pretreatment chamber 11, high frequency power is applied to first electrode 13 from high frequency source 14 so as to generate a gas plasma containing halogen atoms. The whole surface of substrate 12, provided with a first conductive layer partially covered with an insulating layer, is thereby treated by this plasma.

The gas containing halogen atoms may be a mixture of a halogen source gas and inert gas. It is preferable that the halogen source gas is $Cl_2$ gas, $F_2$ gas, chloride gas or fluoride gas. The fluoride includes $SF_6$, $CHF_3$, $C_2F_6$, $C_3F_8$, $CF_4$, $NF_3$, $BF_3$, $AsF_3$, $AsF_3$, $PF_3$ or $PF_5$. The chloride gas includes $AsCl_3$, $AsCl_5$, $BCl_3$, $CCl_4$, $PCl_3$ or $PCl_5$.

$F_2$ gas and fluoride gas are preferable as halogen source gases described above, the reason is that the fluorine atom has a smaller atomic radius and atomic weight than the silicon atom. In comparison to other halogen atoms, therefore, there is less ion bombardment on the surface of the silicon dioxide or silicon nitride insulating layer, and consequently the surface of the layer is not easily damaged.

As inert gas, nitrogen or the rare gas such as helium, neon, argon or krypton may be used.

The partial pressure of the halogen source gas in the gas containing halogen atoms, is preferably be lower than the partial pressure of the inert gas, and more preferably $10^{-6}$ Torr–$10^{-3}$ Torr. The reason why it is preferable that the partial pressure of the halogen source gas is no greater than $10^{-3}$ Torr is that if its concentration exceeds this level, the conductive material of the first conductive layer reacts with the halogen source gas to form a metal halide, and the resistance between the first conductive layer and second conductive layer rises. Further, the reason why the partial pressure should be greater than $10^{-6}$ Torr is that below $10^{-6}$ Torr, the quantity of halogen adsorbed by the surface of the insulating layer is small. As a result, the surface of the insulating layer is activated, and when the second conductive layer is deposited, conductive material grows also on this surface so that good growth selectivity cannot be obtained.

It is moreover preferable that the pressure in pretreatment chamber 11 is $10^{-3}$–1 Torr.

Gate 15 is then opened, substrate 22 which has been pretreated is transferred to and mounted on second electrode 23 in reaction chamber 21, and gate valve 15 is closed. The specified gas is then introduced into reaction chamber 21, and selective CVD is carried out on the exposed first conductive layer so as to form a second conductive layer.

The material of the second conductive layer may be aluminum, molybdenum, copper, tungsten, titanium, molybdenum silicide, tungsten silicide, titanium silicide, tantalum silicide or titanium nitride. It may also be a highly conductive semiconductor such as silicon containing impurities.

After conductive material has been deposited over the whole surface, it is patterned to form a third conductive layer connected to the second conductive layer. The material of this third conductive layer may be aluminum, molybdenum, copper, tungsten, titanium, molybdenum silicide, tungsten silicide, titanium silicide, tantalum silicide or titanium nitride. It may also be a highly conductive semiconductor such as silicon containing impurities.

In the above example, halogen source gas and inert gas are introduced into the pretreatment chamber in order to carry out plasma treatment. A gas plasma containing halogen atoms can however also be formed by introducing halogen source gas into the pretreatment chamber and adsorbing it on the inner wall before placing the substrate inside, then installing the substrate, and applying high frequency power to first electrode 13 from a high frequency source 14 so as to desorb halogen atoms from the wall.

Further, instead of introducing halogen source gas into the pretreatment chamber and adsorbing it on the inner wall, a halogen-containing material may be installed in the chamber. In this case, halogen atoms are easily knocked out of the halogen-containing material by means of a discharge inside the pretreatment chamber. The halogen-containing material may be a fluorine resin.

In this way, by introducing halogen source gas into the pretreatment chamber and adsorbing it on the inner wall, or by installing a halogen-containing material in the pretreatment chamber, that is by introducing a gas or solid material containing halogen atoms into the pretreatment chamber before generating the plasma, a constant number of halogen atoms can be supplied in the plasma. The process can therefore be carried on smoothly, and the treatment results are highly reproducible.

Further, an inert gas plasma treatment may also be carried out before pretreatment by the gas plasma containing halogen atoms. By treating the surface of the sample with an inert gas plasma, contaminants on the first conductive layer are removed, and thereafter, when treatment is carried out with the gas plasma containing halogen atoms, the surface of the insulating layer which was rendered active by the inert gas plasma, can be rendered inactive.

The impurities on the first conductive layer are thereby completely removed, and selective CVD can be carried out on the first conductive layer without any loss of selectivity.

In the pretreatment with a gas plasma containing halogen atoms described above, contaminants on the exposed surface of the first conductive layer are physically ejected, mainly by impact of inert gas ions. At the same time, dangling bonds formed by ion bombardment on the surface of the insulating layer combine with halogen atom ions, or halogen radicals etch the excess silicon so that the surface of the insulating layer, which was initially rendered active, is then rendered inactive. As this activation and deactivation proceed simultaneously, it is possible to maintain a balance between the two such that the second conductive layer is deposited with a low contact resistance on the first conductive layer, and with a high selectivity.

If there is a high concentration of halogen atoms in the gas, halide might be deposited on part of the surface of the first conductive layer after pretreatment. In such a case, the halide can be removed by treating the substrate with a hydrogen gas plasma after pretreatment with the gas plasma containing halogen atoms. It is preferable that this treatment with a hydrogen gas plasma is carried out in a reaction chamber.

In this way, by carrying out a hydrogen gas plasma treatment inside the reaction chamber, the surface of the first conductive layer can be prevented from being oxidized right up to the deposition of the second conductive layer.

We shall now describe this invention in more detail with reference to specific examples.

EXAMPLE 1

FIGS. 5A–5F are sectional views showing the interconnection layer structure according to one embodiment of this invention in the sequence in which processes are carried out.

Figure 5A:
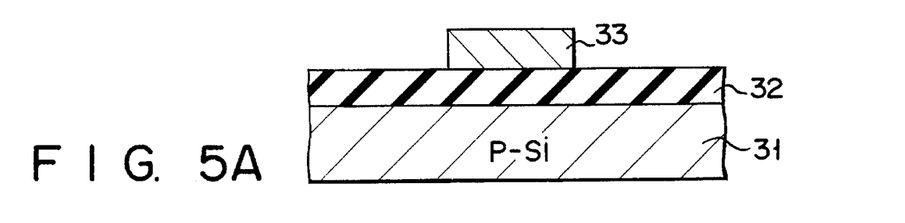
FIGS. 5A–5F are sectional views showing the film deposition method of one embodiment of this invention.

First, an insulating layer such as for example a silicon dioxide layer (32) formed by CVD, is deposited on a silicon substrate (31) with an element such as a field effect transistor, although not shown in the figures. An aluminum layer is then deposited on the silicon dioxide layer (32), and the aluminum layer is patterned by PEP and reactive ion etching so as to form a first interconnection layer (33). This interconnection layer extends in a direction which runs perpendicular to the plane of the paper and in towards it (FIG. 5A).

Figure 5B:
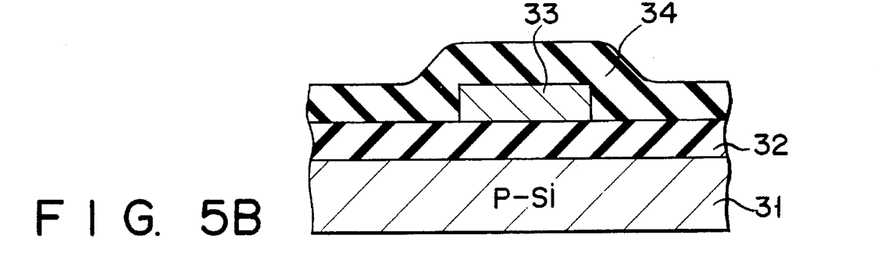

Next, a silicon dioxide layer (34) of thickness 1400 A which acts as an inter-layer insulating layer, is formed by plasma CVD using saline ($SiH_4$) and oxygen ($O_2$) as source gases.

Figure 5C:
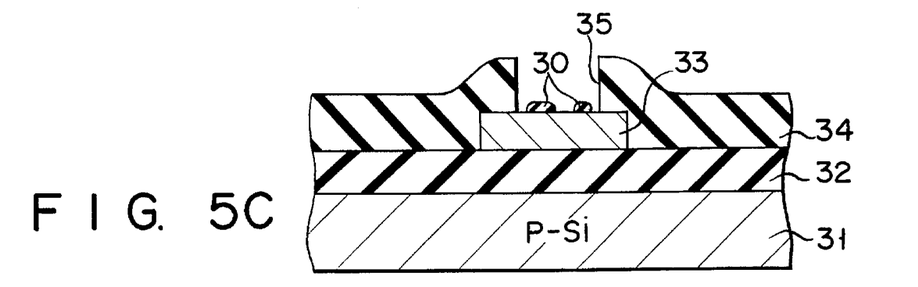

A hole (35) is then formed in silicon oxide layer (34) in a desired region on first interconnection layer (33), and in this way, a sample is prepared from the silicon substrate. It was established by means of a separate experiment that a film of contaminants (30), consisting of fluoride, carbide, oxide or the mixture thereof with good insulating properties and considered to have been formed mainly when hole (35) was patterned, had also been deposited on the surface of first interconnection layer (33) (FIG. 5C).

Figure 5D:
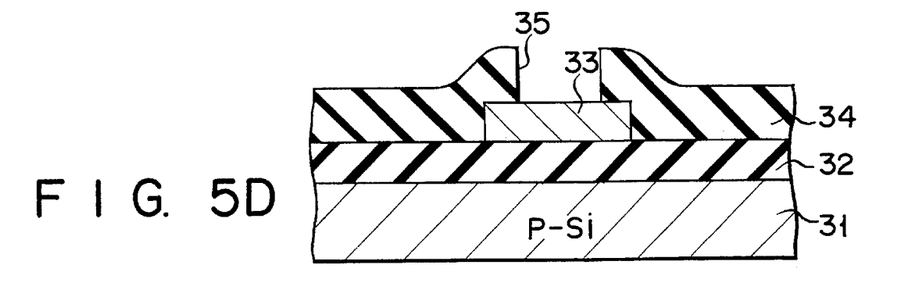

Next, this sample was installed in the pretreatment chamber 11 of a thin film deposition apparatus shown in FIG. 4, and its whole surface was etched. This etching was carried out by a gas $SF_6$ diluted with argon ($SF_6$ concentration 1%). The gas flow rate was 10 cc/min, pressure was $2\times10^{-2}$ Torr, substrate temperature was 20° C., high frequency power was 200 W, substrate bias was −500 V, and etching time was approx. 1 min. The surface of first interconnection layer (33) was thereby etched to a depth of 120 A, and the surface of insulating layer (34) was etched to a depth of approx. 300 A. The etching conditions may differ from those indicated here if they permit etching to be carried out to greater depths. In this way, the contaminant film (30) adhering to the interior of the hole was removed (FIG. 5D).

Figure 5E:
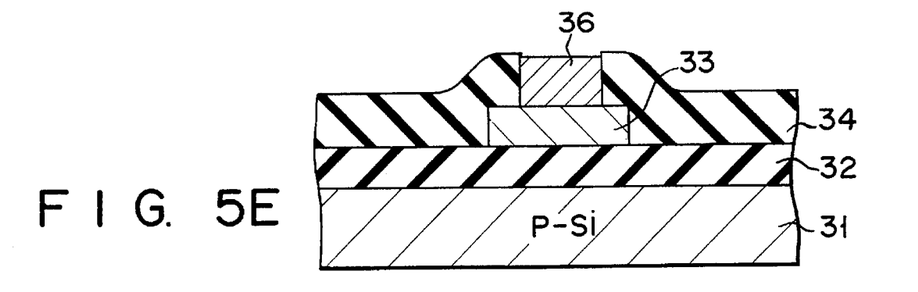

Subsequently, the sample treated as described above, was transferred to reaction chamber 21 without being exposed to the air, and a tungsten layer (36) was filled in hole (35) by selective CVD. The deposition conditions for tungsten layer (36) were deposition temperature 300° C., deposition pressure 0.2 Torr, tungsten hexafluoride ($WF_6$) flow rate 10 cc/min, saline ($SiH_4$) flow rate 10 cc/min and hydrogen flow rate 500 cc/min. The tungsten layer growth speed was approx. 2000 A/min (FIG. 5E).

Figure 6:
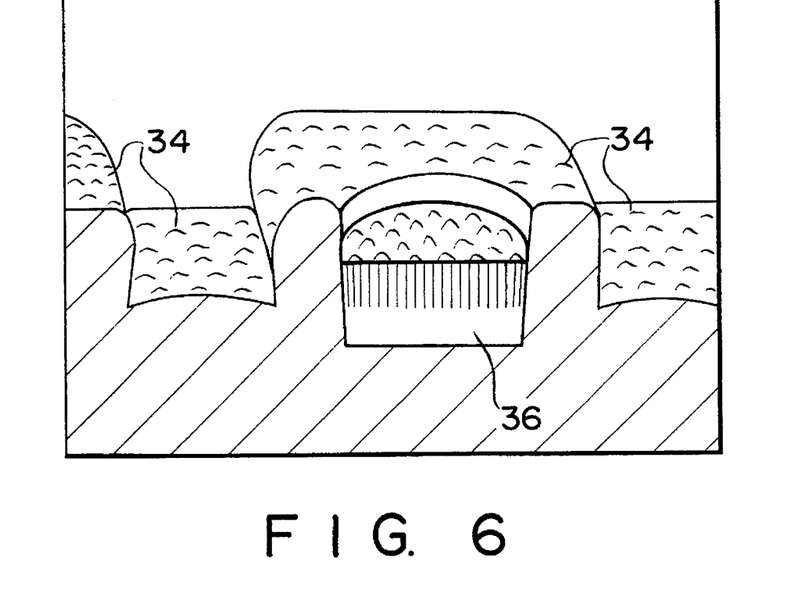
FIG. 6 is a sketch of an SEM photograph of the structure obtained by the film deposition method of one embodiment of this invention.
Figure 7:
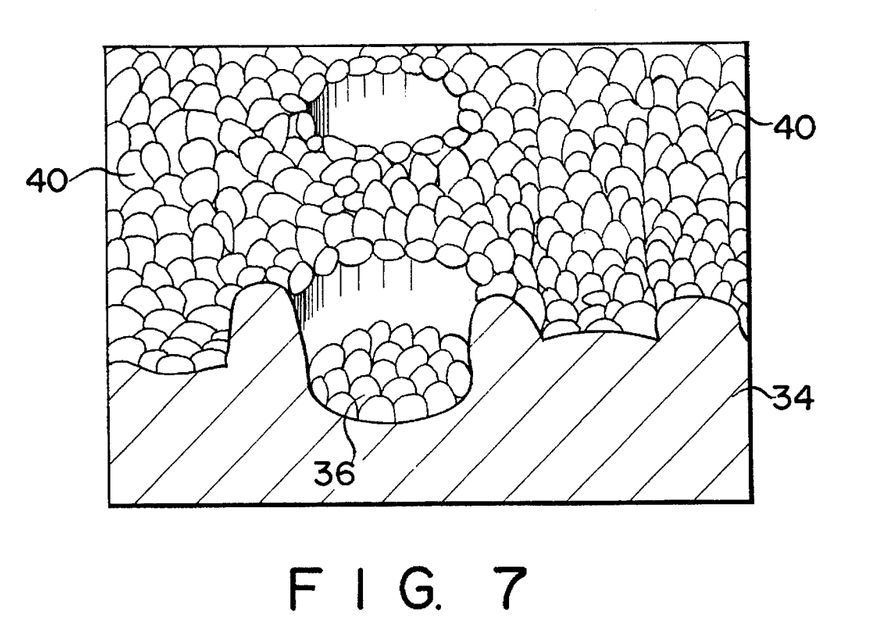
FIG. 7 is a sketch of an SEM photograph of the structure obtained by a film deposition method in the prior art.

By means of the above processes, as shown in the sketch of the SEM photograph in FIG. 6, tungsten layer (36) can be filled in holes with very good selectivity, that is, there was no growth of the tungsten layer on insulating layer (34). For comparison purposes, FIG. 7 shows a sketch of an SEM photograph of the case where argon gas was used alone for sputtering in the above etching process instead of $SF_6$ gas diluted with argon gas, and a tungsten layer (36) was then formed in the same way. It is seen that in this latter case, the tungsten (40) grows both in the hole and on the insulating layer (34), and good growth selectivity cannot be obtained.

Figure 5F:
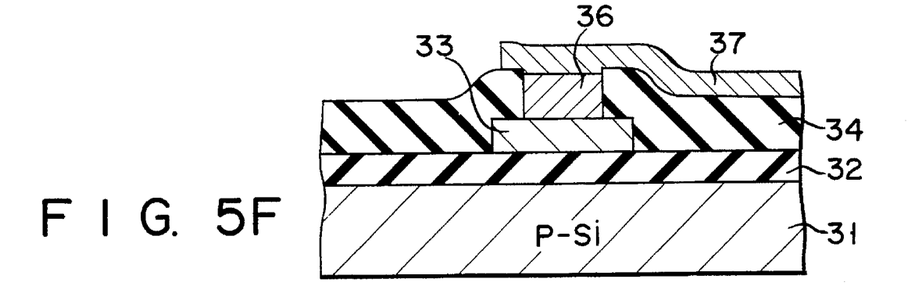

Further, after forming a tungsten layer (36), CVD was carried out with trimethyl aluminum ($Al(CH_3)_3$) as the source gas so as to deposit aluminum over the whole surface, and a second interconnection layer of aluminum (37) was formed by processing to give a desired wiring pattern (FIG. 5F).

Tungsten was used here as the second conductive layer. A second conductive layer may however also be formed by filling the hole (35) with a layer of monocrystalline silicon using, for example, a gas mixture of $SiH_4Cl_2$ (0.75 l/min), HCl (1 l/min) and $H_2$ (180 l/min), a pressure of 100 Torr, a substrate temperature of 1000° C. and a growth rate of 300 A/min, and then forming a P or N-type silicon layer by implanting ions of the desired conductivity type.

EXAMPLE 2

Figure 8A:
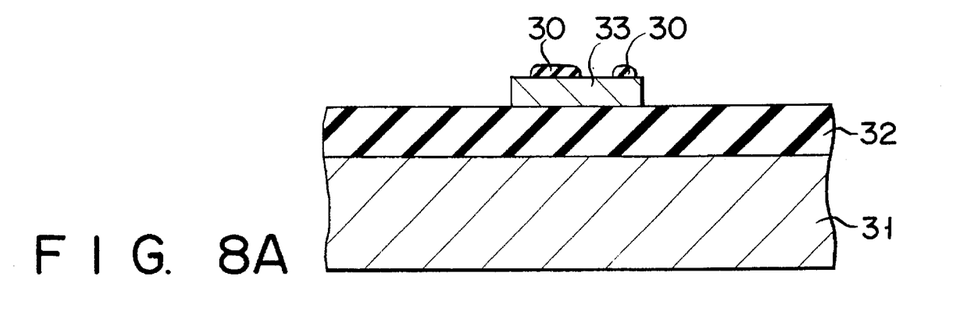
FIGS. 8A–8C are sectional views showing the film deposition method of another embodiment of this invention.
Figure 8B:
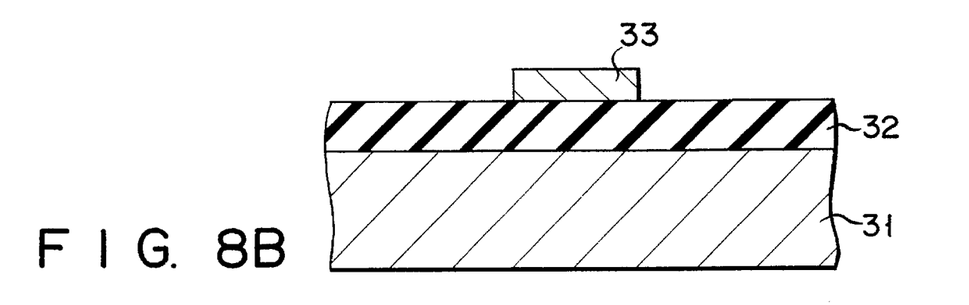
Figure 8C:
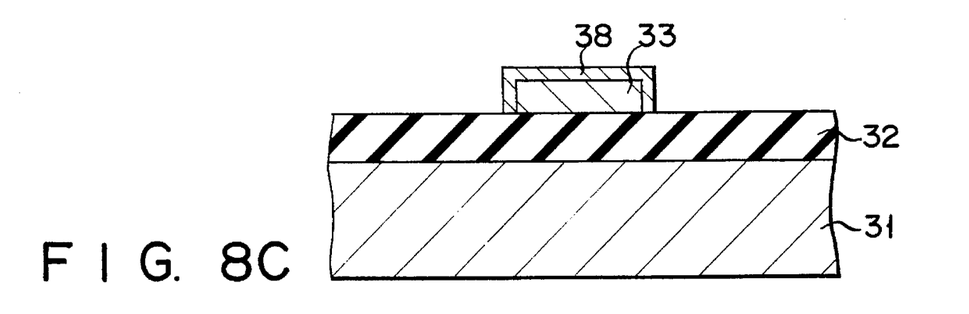

We shall now explain another embodiment of this invention with reference to FIGS. 8A–8C.

Firstly, as in the preceding example, an insulating layer (32) is deposited on a silicon substrate (31), and a first interconnection layer of aluminum (33) is formed on the insulating layer. After formation, a contaminant film (30) was found to be adhering to the surface of the first interconnection layer (33) (FIG. 8A).

Next, a sample of this silicon substrate (31) was installed in the pretreatment chamber 11 of the thin film deposition apparatus shown in FIG. 4, and the surface of the sample was etched in the chamber. As in Example 1, the etching was carried out by $SF_6$ gas diluted with argon ($SF_6$ concentration 1%). The gas flow rate was 10 cc/min, pressure was $2\times10^{-2}$ Torr, substrate temperature was 20° C., high frequency power was 200 W, substrate bias was −500 V, and etching time was approx. 1 min. The surface of first interconnection layer (33) was etched to a depth of approx. 120 A and the surface of insulating layer (32) to a depth of approx. 300 A, thereby removing the surface of contaminant film (30) (FIG. 8B). According to experimental measurements made by the inventors of this invention, said contaminant film becomes mixed with aluminum with increasing depth towards the bottom. This process removes only the surface portion of the contaminant film which has a small aluminum content, and it is therefore quite possible to carry out selective growth in subsequent processing.

Subsequently, the sample was transferred to reaction chamber 21 without exposing it to the air, and a tungsten layer (38) of approx. 1000 A was grown by selective CVD on the exposed surface of first interconnection layer (33) only. The growth conditions were deposition temperature 300° C., deposition pressure 0.2 Torr, tungsten hexafluoride ($WF_6$) flow rate 10 cc/min, saline ($SiH_4$) flow rate 10 cc/min and hydrogen ($H_2$) flow rate 500 cc/min. The growth rate was 500 A/min (FIG. 8C).

By the above process, a interconnection layer structure can be formed wherein the surface of a first interconnection layer of aluminum is completely covered by a layer of tungsten.

EXAMPLE 3

Hydrogen fluoride gas was passed into pretreatment chamber 11 of the thin film deposition apparatus shown in FIG. 4 at a rate of 10 cc/min for 1 min. In this process, most of the hydrogen fluoride gas is adsorbed on the inner wall of chamber 11. Subsequently, a sample prepared by the same method as in Example 1 and shown in FIG. 5C was installed in this pretreatment chamber 11, and sputter etching was carried out over the whole surface of the sample. The conditions of the sputter etching were argon gas flow rate 10 cc/min, pressure $2\times10^{-3}$ Torr, high frequency power 300 W, substrate bias −400 V and etching time 1 min. By subjecting the whole surface of the sample to sputter etching under these conditions, the surface of aluminum layer 33 was etched by approx. 120 A and the surface of silicon dioxide layer 34 by approx. 500 A. By this pretreatment, fluoride, carbide and oxide adhering to the surface of aluminum layer 33 were removed.

Next, as in Example 1, the sample was transferred to reaction chamber 21. A W film 36 was formed selectively on the exposed aluminum layer 33, and an aluminum layer 37 connected to this W film 36 was also formed.

In this Example, W film 36 can be filled in opening 35 with extremely good selectivity. This is due to the fact that fluoride adsorbed on the inner wall of pretreatment chamber 11 is stripped off by the discharge to form fluorine radicals and ions, and these render the surface of silicon dioxide layer 34 inactive. Further, the contact resistance between aluminum layer 33 and W film 36 can be reduced by decreasing the flow rate of hydrogen fluoride into pretreatment chamber 11.

EXAMPLE 4

Figure 9A:
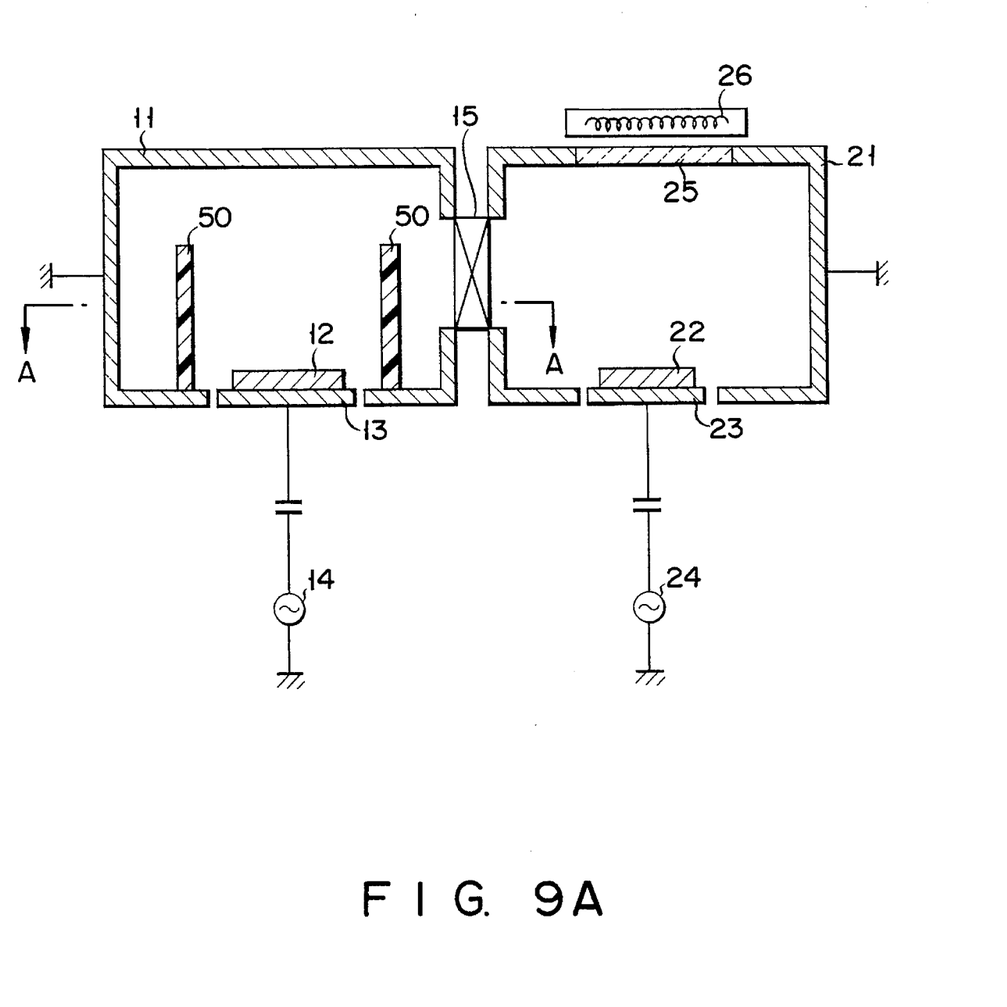
FIG. 9A is a sectional view showing the film deposition apparatus for carrying out the method of a further embodiment of this invention.
Figure 9B:
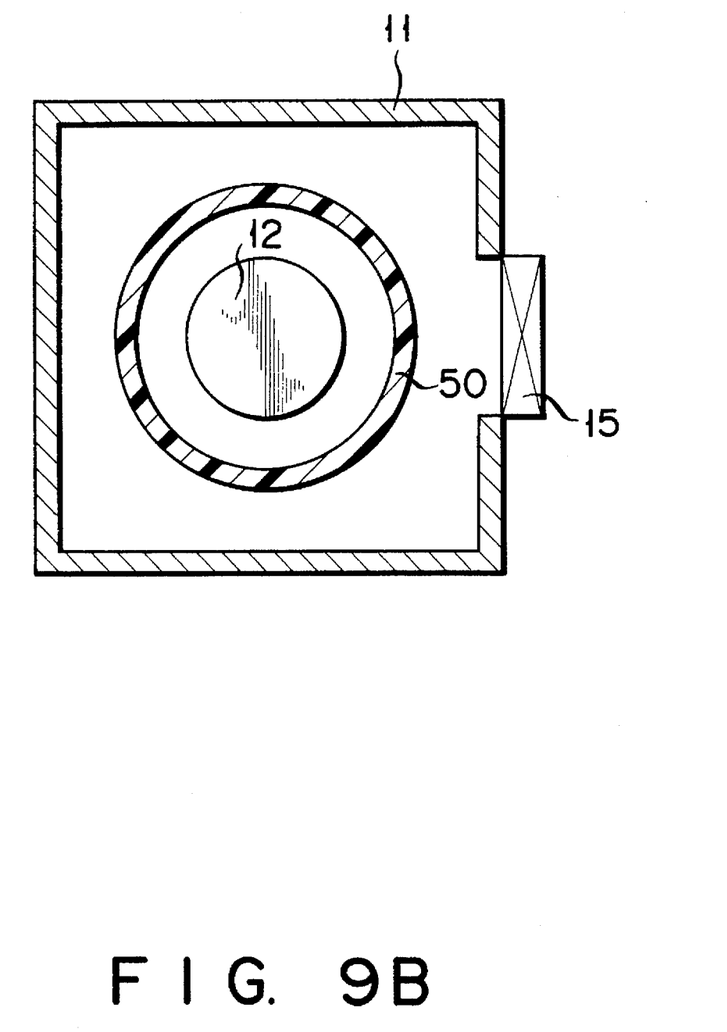
FIG. 9B is a sectional view cut along line A—A of FIG. 9A.

Selective deposition was carried out in the same sequence as that of Example 3, except that instead of adsorbing hydrogen fluoride gas on the inner wall of pretreatment chamber 11, a partition 50 made of a fluorine resin was installed in the chamber surrounding the sample 12 as shown in FIGS. 9A and 9B.

In this Example, partition 50 is subjected to sputtering by plasma so as to generate fluorine radicals and fluorine ions. The same effect is therefore obtained as in Example 3.

EXAMPLE 5

A sample treated as in Example 1 and shown in FIG. 5D was transferred from pretreatment chamber 11 to reaction chamber 21, and the sample surface was treated by a $H_2$ gas plasma. The treatment conditions were $H_2$ gas flow rate 2 l/min, pressure 1 Torr, substrate temperature 20° C., applied high frequency power 200 W, substrate bias −10 V and treatment time 30 seconds.

Subsequently, as in Example 1, a W film 36 was formed selectively on exposed aluminum layer 33, and an aluminum layer 37 connected to this W film 36 was also formed.

In this Example, the formation of W film 36 takes place when there is no natural oxide film or other contaminants on the exposed surface of aluminum layer 33, that is, when it is extremely clean. The contact resistance between aluminum layer 33 and W film 36 is therefore so low that it can be ignored.

EXAMPLE 6

Figure 10A:
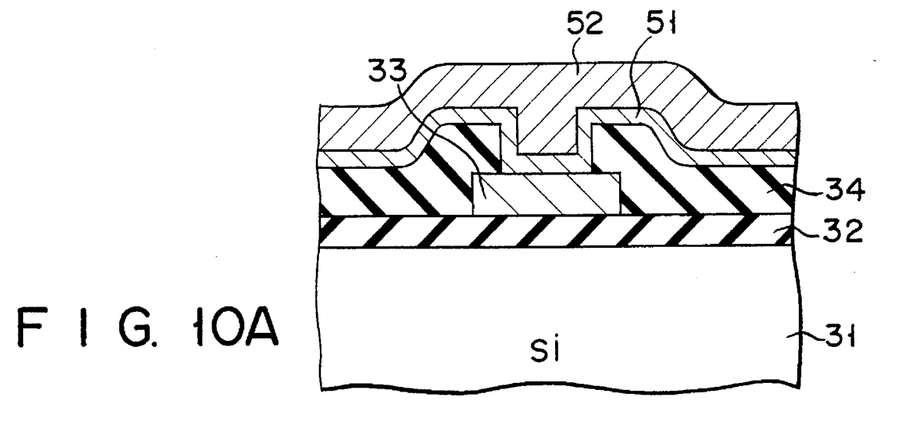
FIGS. 10A–10C are sectional view showing the film deposition method of another embodiment of this invention.

A $WSi_2$ layer 51 and a W layer 52 were formed successively on the surface of a sample treated by an $H_2$ gas plasma as in Example 5, as shown in FIG. 10A. $WSi_2$ layer 51 was formed using a mixture of $WF_6$ gas (10 cc/min) and $SiH_4$ gas (200 cc/min) with a pressure of 0.2 Torr, substrate temperature of 300° C. and deposition rate of 500 A/min. The thickness of this $WSi_2$ layer 51 was 3000 A. W layer 52 was formed using a mixture of $WF_6$ gas (10 cc/min) and $SiH_4$ gas (10 cc/min) with a pressure of 0.2 Torr, substrate temperature of 300° C. and deposition rate of 500 A/min. The thickness of this W layer 52 was 1 μm.

Figure 10B:
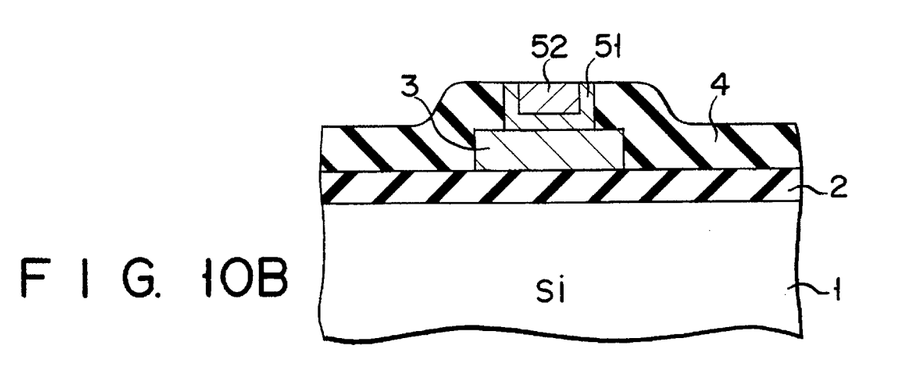
Figure 10C:
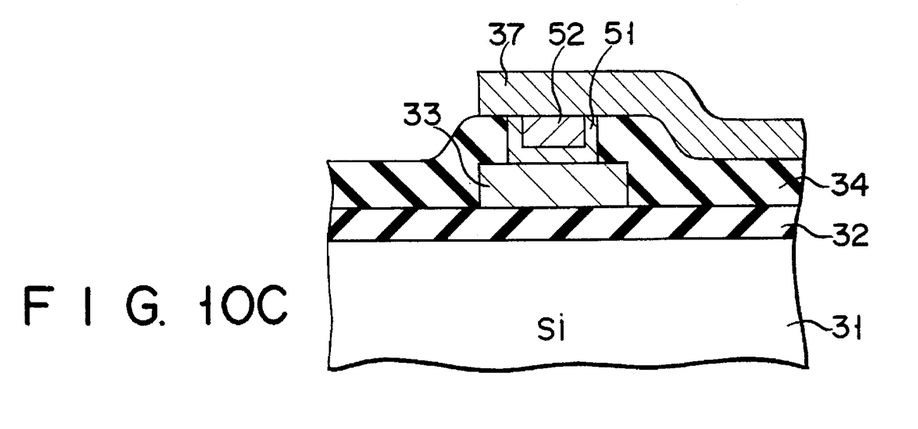

The sample was then returned to pretreatment chamber 11 and etching was carried out over the whole surface by an $SF_6$ gas plasma such that $WSi_2$ layer 51 and W layer 52 were left only in opening 35, as shown in FIG. 10B. This process was carried out in pretreatment chamber 11 so as not to contaminate reaction chamber 21. A second aluminum interconnection layer 37 was then formed as in the preceding Examples, as shown in FIG. 10C.

The same effect is obtained in this Example as in Example 5.

What is claimed is:

1. A method of manufacturing a semiconductor device, comprising the steps of depositing an insulating layer on a first conductive layer formed on a substrate; patterning the insulating layer; treating the surface of the insulating layer and the exposed surface of the first conductive layer with a gas plasma containing halogen atoms at a pressure of $10^{-6}$–$10^{-3}$ Torr, and depositing selectively a conductive material by vapor growth on the exposed surface of the first conductive layer so as to form a second conductive layer.

2. A method according to claim 1, wherein the material of said first conductive layer is one selected from the group consisting of aluminum, molybdenum, tungsten, copper, titanium, molybdenum silicide, tungsten silicide, titanium silicide, titanium nitride, silicon, germanium, GaAs and InP.

3. A method according to claim 1, wherein the material of said insulating layer is one selected from the group consisting of silicon dioxide, silicon nitride, and these substances doped with impurities.

4. A method according to claim 1, wherein the material of said substrate is one selected from the group consisting of silicon, germanium, GaAs, InP and sapphire.

5. A method according to claim 1, wherein the material of said second conductive layer is one selected from the group consisting of aluminum, molybdenum, copper, tungsten, titanium, molybdenum silicide, tungsten silicide, titanium silicide, tantalum silicide, titanium nitride and silicon containing impurities.

6. A method according to claim 1, wherein said gas plasma containing halogen atoms is a plasma of a mixture of a halogen source gas and an inert gas.

7. A method according to claim 6, wherein said inert gas is at least one selected from the group consisting of helium, neon, nitrogen, argon and krypton.

8. A method according to claim 6, wherein the partial pressure of halogen source gas in said gas containing halogen atoms is lower than the partial pressure of the inert gas.

9. A method according to claim 1, wherein said plasma comprises a gas containing chlorine atoms or fluorine atoms.

10. A method according to claim 9, wherein said gas is at least one selected from the group consisting of $Cl_2$, $AsCl_3$, $AsCl_5$, $BCl_3$, $CCl_4$, $PCl_3$, $PCl_5$, $SF_6$, $AsF_3$, $AsF_5$, $PF_3$, $PF_5$, $CHF_3$, $C_2F_6$, $C_3F_8$, $CF_4$ and $NF_3$.

11. A method according to claim 1, further comprising the step of treating the treated surfaces by a gas plasma containing hydrogen atoms.

12. A method according to claim 1, further comprising the step of forming a third conductive layer connected to said second conductive layer.

13. A method according to claim 12, wherein the material of said third conductive layer is one selected from the group consisting of aluminum, molybdenum, copper, tungsten, titanium, molybdenum silicide, tungsten silicide, titanium silicide, tantalum silicide, titanium nitride and silicon containing impurities.

14. A method of manufacturing a semiconductor device comprising the steps of:

forming an insulating layer on a first conductive layer deposited on a substrate; patterning the insulating layer;

treating the surface of the insulating layer and the exposed surface of the first conductive layer by a gas plasma containing halogen atoms at a pressure of $10^{-6}$–$10^{-3}$ Torr; and depositing selectively a conductive material by vapor growth on the exposed surface of the first conductive layer so as to form a second conductive layer, said gas plasma containing halogen atoms being formed by providing a halogen source in a treatment chamber, and passing a discharge through the chamber.

15. A method according to claim 14, wherein said halogen source is provided by introducing a halogen source gas into the treatment chamber, and adsorbing the gas on the inner wall of the chamber.

16. A method according to claim 14, wherein said halogen source is provided by installing a halogen containing material in the treatment chamber.

17. A method of manufacturing a semiconductor device comprising the step of:

forming an insulating layer on a first conductive layer deposited on a substrate; patterning the insulating layer;

treating the surface of the insulating layer and the exposed surface of the first conductive layer by a gas plasma containing halogen atoms at a pressure of $10^{-6}$–$10^{-3}$ Torr;

treating the treated surfaces by a gas plasma containing hydrogen atoms; and depositing selectively a conductive material by vapor growth on the exposed surface of the first conductive layer so as to form a second conductive layer, said gas plasma containing halogen atoms being formed by providing a halogen source in a treatment chamber, and passing a discharge through the chamber.

18. A method according to claim 17, further comprising also the step of treating the surface by an inert gas plasma prior to the step of treating by the gas plasma containing halogen atoms.

* * * * *

UNITED STATES PATENT AND TRADEMARK OFFICE
CERTIFICATE OF CORRECTION

PATENT NO. : 5,620,925
DATED : April 15, 1997
INVENTOR(S) : Rempei NAKATA, et al.

It is certified that error appears in the above-indentified patent and that said Letters Patent is hereby corrected as shown below:

On title page, item [54] and col. 1, line 3, title should read as follows:

-- [54] METHOD OF MANUFACTURING SEMICONDUCTOR DEVICE USING A HALOGEN PLASMA TREATMENT STEP--

Signed and Sealed this

Twelfth Day of August, 1997

Attest:

BRUCE LEHMAN

Attesting Officer

Commissioner of Patents and Trademarks